(12) United States Patent
Tamai et al.

(10) Patent No.: US 6,459,255 B1
(45) Date of Patent: Oct. 1, 2002

(54) CURRENT DETECTOR

(75) Inventors: Yasuhiro Tamai; Yoshinori Ikuta; Takashi Gohara; Mitsuaki Morimoto, all of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/640,067

(22) Filed: Aug. 17, 2000

(30) Foreign Application Priority Data

Sep. 2, 1999 (JP) .............................. 11-249280

(51) Int. Cl.[7] .............................................. G01R 33/00
(52) U.S. Cl. .............................. 324/117 H; 324/117 R
(58) Field of Search ..................... 324/117 H, 117 R, 324/127, 239, 228

(56) References Cited

U.S. PATENT DOCUMENTS 5,172,052 A * 12/1992 Wells ...................... 324/117 H

FOREIGN PATENT DOCUMENTS

JP   63-253264   10/1988
JP   5-223849    9/1993

* cited by examiner

Primary Examiner—N. Le
Assistant Examiner—James C. Kerveros
(74) Attorney, Agent, or Firm—Finnegan, Henderson, Farabow, Garrett, & Dunner, L.L.P.

(57) ABSTRACT

A current detector having a linear conductor $11_1$, $11_2$, a linear to-be measured conductor 10 disposed substantially in parallel to the conductor $11_1$, $11_2$ and through which a to-be measured current flows. A Hall element 20 disposed in the vicinity of the to-be measured conductor 10 such that a magnetic flux generated by the to-be measured current flowing through the to-be measured conductor 10 enter into a magnetic-force sensing face 21 substantially perpendicularly. A substrate 30 for supporting the conductor and the to-be measured conductor 10 such that the magnetic flux generated by a current flowing through the conductor becomes substantially parallel to the magnetic-force sensing face +21 in the magnetic-force sensing face 21 of the Hall element 20.

9 Claims, 7 Drawing Sheets

CURRENT DETECTOR

BACKGROUND OF THE INVENTION

1. Field of the Invention

The present invention relates to a current detector for detecting a current flowing through an electric circuit mounted to equipment such as an automobile, and more particularly, to a technique for enhancing a detection precision of a current when a plurality of conductors are arranged side-by-side.

2. Description of Related Art

There is a conventionally known current detector for detecting a current flowing through an electric circuit mounted in, e.g., an automobile using a Hall element which is one of magnetic-electric power converting element. One example of such current detectors is disclosed in Japanese Patent Application Laid-open No. H5-223849. This current detector comprises a conductor flowing a current to be detected (which will be referred to as "to-be detected current", hereinafter), and having a notch formed on the same plane, or having a loop-like current path formed by bending. The current detector also comprises a magnetic-electric power converting element for converting a magnetic flux generated by the to-be detected current I flowing to the conductor.

In this current detector, if the to-be detected current flows to the loop-like current path formed on the conductor, a magnetic flux is generated. This magnetic flux is converted into an electric signal by the magnetic-electric power converting element and, with this conversion, the electric signal is proportional to a magnitude of the to-be detected current. Since this current detector can sense more than two times magnetic fluxes as compared with a case in which the magnetic-electric power converting element is disposed in the vicinity of a linear conductor, it is possible to enhance the detecting precision of a current. Since his current detector can sense more than two times magnetic fluxes as compared with a case in which the magnetic-electric power converting element is disposed in the vicinity of a linear conductor, it is possible to enhance the detecting precision of a current.

Japanese Patent Application Laid-open No. S63-253264 (Japanese Patent Publication No. H8-3499) discloses another example of the current detector. This current detector comprises a conductor wire through which a to-be detected current flows, magnetic-electric power converting elements for converting a magnetic field generated around the conductor wire when the to-be detected current flows through the conductor wire in opposed regions around the conductor wire, and a synthesizing section for synthesizing magnetic-electric power conversion outputs from the magnetic-electric power converting elements.

According to this current detector, the magnetic-electric power converting elements have the same characteristics, and they receive the same magnetic fields in the opposite direction from each other with respect to the magnetic field generated when a current flows through the conductor wire. Therefore, since the outputs from the elements have opposite phases, the output of the synthesizing section about twice as large as the output of one of the elements when these outputs are differentially synthesized by the synthesizing section. On the other hand, when the entire current detector is affected by an external magnetic field, the outputs of the magnetic-electric power converting elements are the same phases with respect to the external magnetic field. Therefore, in the outputs differentially synthesized by the synthesizing section, an output signal based on the external magnetic field is canceled.

However, in the case of the current detector disclosed in Japanese Patent Application Laid-open No. H5-223849, the magnetic flux generated by a current flowing through a conductor other than the to-be measured conductor becomes disturbance which affects the detection result and thus, there is a problem that a current flowing through the to-be measured conductor can not be detected precisely. Especially when a current is detected using a magnetic-electric power converting element in an environment in which a plurality of conductors are arranged side-by-side such as an electric connection box of an automobile, since the magnetic flux generated by a current flowing through a conductor other than the to-be measured conductor interferes the detecting operation, there is a problem that the current detecting precision can not be enhanced.

Further, in the case of the current detector disclosed in Japanese Patent Application Laid-open No. S63-253264 (Japanese Patent Publication No. H8-3499), it is necessary to use two magnetic-electric power converting elements with respect to one conductor, there is a problem that the costs of the current detector is increased.

SUMMARY OF THE INVENTION

It is an object of the present invention to provide an inexpensive current detector capable of precisely detecting a current flowing through a to-be measured conductor even when a plurality of conductors are arranged side-by-side such as an electric connection box of an automobile.

To achieve the above object, according to a first aspect of the invention, there is provided a current detector comprising a linear conductor, a linear to-be measured conductor disposed substantially in parallel to the conductor and through which a to-be measured current flows, a magnetic-electric power converting element disposed in the vicinity of the to-be measured conductor such that a magnetic flux generated by the to-be measured current flowing through the to-be measured conductor enter into a magnetic-force sensing face substantially perpendicularly, and a substrate for supporting the conductor and the to-be measured conductor such that the magnetic flux generated by a current flowing through the conductor becomes substantially parallel to the magnetic-force sensing face in the magnetic-force sensing face of the magnetic-electric power converting element.

With the first aspect, a positional relation between the magnetic-electric power converting element disposed in the vicinity of the to-be measured conductor and a conductor other than the to-be measured conductor is adjusted by the supporting substrate supporting these members. That is, the to-be measured conductors are disposed on the substrate such that the magnetic flux generated by the to-be measured current flowing through the to-be measured conductor enters into the magnetic-force sensing face perpendicularly, and the magnetic flux generated by a current flowing through the conductor other than the to-be measured conductor becomes substantially parallel to the magnetic-force sensing face in the magnetic-force sensing face of the magnetic-electric power converting element. Therefore, the magnetic-electric power converting element only senses a magnetic flux generated by the to-be measured current flowing through the to-be measured conductor, and does not sense a magnetic flux generated by a conductor other than the to-be measured conductor. Thus, it is possible to precisely detect a to-be measured current flowing through the to-be measured conductor. Further, since the current detector has one magnetic-electric power converting element, it is possible to provide an inexpensive current detector.

According to a second aspect of the invention, there is provided a current detector comprising a to-be measured conductor formed with a bent portion which is bent into a U-shape or a crank-shape and through which a to-be measured current flows, a magnetic-electric power converting element disposed in the vicinity of the bent portion such that a magnetic flux generated by the to-be measured current flowing through the to-be measured conductor enter into a magnetic-force sensing face substantially perpendicularly, and a linear conductor disposed such that a magnetic flux generated when a current flows becomes substantially parallel to the magnetic-force sensing face in the magnetic-force sensing face of the magnetic-electric power converting element.

With the second aspect, a positional relation between the magnetic-electric power converting element disposed in the vicinity of the to-be measured conductor and a conductor other than the to-be measured conductor is adjusted by the bent portion formed on the to-be measured conductor. That is, the to-be measured conductor is formed with the bent portion, and the magnetic-electric power converting element is disposed in the bent portion such that the magnetic flux generated by the to-be measured current flowing through the to-be measured conductor enters into the magnetic-force sensing face of the magnetic-electric power converting element perpendicularly. The conductor other than the to-be measured conductor is disposed such that the magnetic flux generated flowing through the conductor becomes substantially parallel to the magnetic-force sensing face in the magnetic-force sensing face of the magnetic-electric power converting element. Therefore, like the first aspect, the magnetic-electric power converting element only senses a magnetic flux generated by the to-be measured current flowing through the to-be measured conductor, and does not sense a magnetic flux generated by a conductor other than the to-be measured conductor. Thus, it is possible to precisely detect a to-be measured current flowing through the to-be measured conductor. Further, since the current detector has one magnetic-electric power converting element, it is possible to provide an inexpensive current detector.

According to a third aspect of the invention, in the current detector of the first aspect, the magnetic-electric power converting element is disposed such that a plane including the conductor passes through a substantially center of the magnetic-force sensing face of the magnetic-electric power converting element and crosses the magnetic-force sensing face substantially perpendicularly.

With the third aspect, the magnetic flux generated when a current flows through a conductor other than the to-be measured conductor becomes substantially parallel to the magnetic-force sensing face in the magnetic-force sensing face of the magnetic-electric power converting element. Therefore when a current flowing through the to-be measured conductor is to be detected, it is possible to substantially eliminate an influence of the magnetic flux generated by the conductor other than the to-be measured conductor.

According to a fourth aspect of the invention, there is provided a current detector comprising a plurality of to-be measured conductors through which to-be measured currents flow respectively, wherein each of the to-be measured conductors includes a bent portion bent into a U-shape or a crank-shape, magnetic-electric power converting elements are disposed in the vicinity of the bent portions of the to-be measured conductors, respectively, such that a magnetic flux generated by a to-be measured current flowing through each of the to-be measured conductors enters into the magnetic-force sensing face substantially perpendicularly, and the plurality of to-be measured conductors are disposed in parallel to one another and disposed such that the bent portions of the to-be measured conductors are not aligned with one another in a longitudinal direction of each the to-be measured conductor.

With the fourth aspect, the magnetic-electric power converting element is disposed in each of the bent portions of the plurality of to-be measured conductors disposed substantially parallel to one another, and the bent portions of the to-be measured conductors are disposed such that they are not aligned to one another in the longitudinal direction of the to-be measured conductor. Therefore, each to-be measured conductor does not influence the magnetic-electric power converting element disposed in other to-be measured conductor. Therefore, it is possible to precisely detect a current flowing through each of the plurality of to-be measured conductors with out being affected by other to-be measured conductors.

According to a fifth aspect of the invention, in the current detector of the fourth aspect, each one of said magnetic-electric power converting elements is disposed such that a plane including said to-be measured conductor of the other magnetic-electric power converting elements excluding said bent portions passes through a substantially center of said magnetic-force sensing face of said former one magnetic-electric power converting element and crosses said magnetic-force sensing face substantially vertically.

With the fifth aspect, in a magnetic-force sensing face of a magnetic-electric power converting element disposed in a certain to-be measured conductor, a magnetic flux generated when a current flows through another to-be measured conductor can precisely become parallel to this magnetic-force sensing face. Therefore, when a current flowing through each to-be measured conductor is to be detected, it is possible to substantially eliminate an influence of a magnetic flux generated by other to-be measured conductor.

According to a sixth aspect of the invention, there is provided a current detector comprising a linear to-be measured conductor through which a to-be measured current flows, a magnetic-electric power converting element disposed in the vicinity of the to-be measured conductor such that a magnetic flux generated by the to-be measured current flowing through the to-be measured conductor enter into a magnetic-force sensing face substantially perpendicularly, and a linear conductor having parallel branch paths for bisecting a flowing current by through holes, and disposed such that magnetic fluxes generated when currents flow through the branch paths cross each other at equal angles with respect to the magnetic-force sensing face on the magnetic-force sensing face of the magnetic-electric power converting element.

With the sixth aspect, magnetic fluxes generated when currents flow through the branch paths cross each other in the magnetic-force sensing face of the magnetic-electric power converting element at equal angles with respect to this magnetic-force sensing face. Therefore, vertical components with respect to the magnetic-force sensing faces of the magnetic fluxes are canceled by each other. Thus, when a current flowing through the to-be measured conductor is to be detected, it is possible to substantially eliminate an influence of the magnetic flux generated by the conductor other than the to-be measured conductor.

According to a seventh aspect of the invention, in the current detector of the sixth aspect, the magnetic-electric power converting element is disposed such that a plane separated away from each of the branch paths through equal distances passes through substantially center of the magnetic-force sensing face of same magnetic-electric power converting element and crosses the magnetic-force sensing face substantially perpendicularly.

With the seventh aspect, a magnetic flux generated when a current flows through a conductor other than the to-be measured conductor is precisely canceled in the magnetic-force sensing face of the magnetic-electric power converting element. Therefore, when a current flowing through the to-be measured conductor is to be detected, it is possible to substantially eliminate an influence of the magnetic flux generated by the conductor other than the to-be measured conductor.

According to an eighth aspect of the invention, in the current detector of the first aspect, the magnetic-electric power converting element is secured to the to-be measured conductor.

With the eighth aspect, since a position of the magnetic-electric power converting element with respect to the to-be measured conductor can be fixed precisely, it is possible to set a magnetic flux generated when a current flows through the to-be measured conductor such that the magnetic flux precisely enters into the magnetic-force sensing face of the magnetic-electric power converting element perpendicularly. Further, a position of the other conductor or the to-be measured conductor with respect to the magnetic-electric power converting element is precisely determined by positioning the other conductor or the to-be measured conductor with respect to the to-be measured conductor and thus, it is easy to assemble the current detector.

According to a ninth aspect of the invention, in the current detector of the second aspect, the magnetic-electric power converting element is disposed such that a plane including the conductor passes through a substantially center of the magnetic-force sensing face of the magnetic-electric power converting element and crosses the magnetic-force sensing face substantially perpendicularly.

With the ninth aspect, a magnetic flux generated when a current flows through a conductor other than the to-be measured conductor becomes substantially parallel to the magnetic-force sensing face. Therefore, when a current flowing through the to-be measured conductor is to be detected, it is possible to substantially eliminate an influence of the magnetic flux generated by the conductor other than the to-be measured conductor.

DESCRIPTION OF PREFERRED EMBODIMENTS

Current detectors of embodiments of the present invention will be explained in detail with reference to the drawings below. In the following description of the embodiments, the same or corresponding parts are designated with the same symbols.

(First Embodiment)

Figure 1:
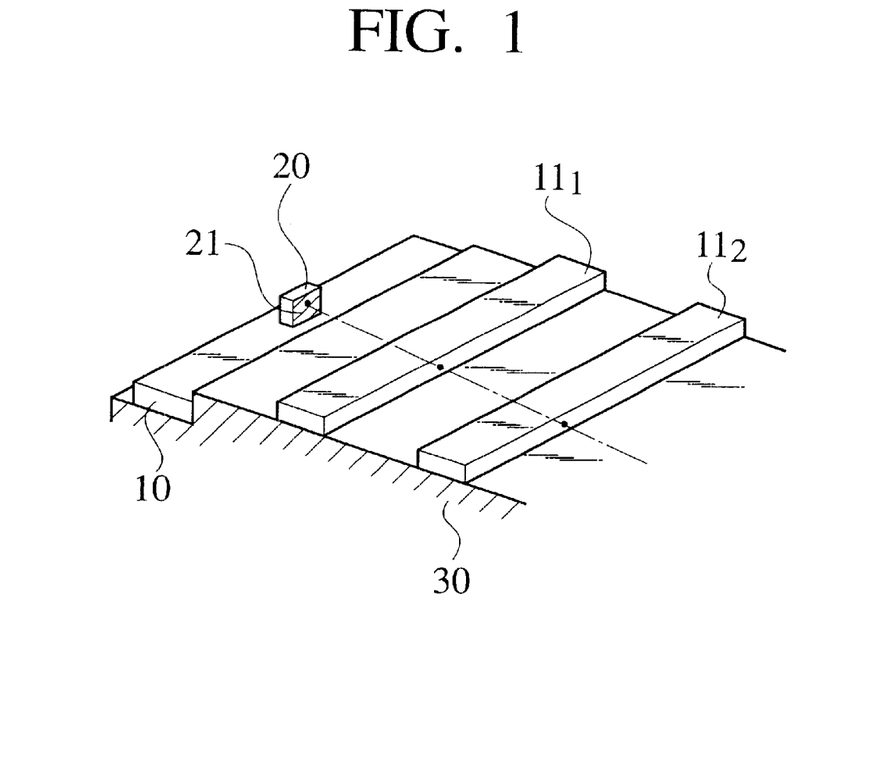
FIG. 1 is a perspective view showing a structure of a current detector according to a first embodiment of the present invention.

FIG. 1 is a perspective view showing a structure of a current detector according to a first embodiment of the present invention. This current detector comprises a conductor to be measured (which will be referred to as "to-be measured conductor, hereinafter) 10, a first conductor $11_1$, a second conductor $11_2$, a Hall element 20 and a substrate 30. These elements are usually accommodated in an electric connection box (not shown). In the first embodiment, a magnetic-force collecting core is not used.

The to-be measured conductor 10 is a linear conductor through which a to-be measured current flows, and the Hall element 20 is secured on the to-be measured conductor 10. The Hall element 20 corresponds to a magnetic-electric power converting element of the present invention. The Hall element 20 generates a voltage (Hall voltage) signal corresponding to a magnetic flux density entering a magnetic-force sensing face (magnetic flux detecting face) of the Hall element 20. A predetermined current is supplied to the Hall element 20 through a lead (not shown). The voltage signal generated by the first Hall element 20 is taken out through a lead (not shown).

The first conductor $11_1$ and the second conductor $11_2$ are linear conductors through which current other than the to-be measured current flows. Although the two conductors $11_1$ and $11_2$ are provided in addition to the to-be measured conductor 10 in the first embodiment, the number of the conductors may be one, or three or more.

The to-be measured conductor 10, the first conductor $11_1$ and the second conductor $11_2$ are placed on and secured to the substrate 30. At that time, the first conductor $11_1$ and the second conductor $11_2$ are disposed substantially in parallel to the to-be measured conductor 10. The substrate 30 is provided with a step for determining a positional relation between the first conductor $11_1$, the second conductor $11_2$ and the Hall element 20 secured to the to-be measured conductor 10.

That is, as shown in FIG. 1, the step is formed on the substrate 30 at such a height that a plane formed by a longitudinally center line of the first conductor $11_1$ and a longitudinally center line of the second conductor $11_2$ passes through a center of a magnetic-force sensing face 21 of the Hall element 20 secured to the to-be measured conductor 10, and the plane is perpendicular to the magnetic-force sensing face 21.

Next, the operation of the current detector having the above structure according to the first embodiment of the present invention will be explained.

Figure 2:
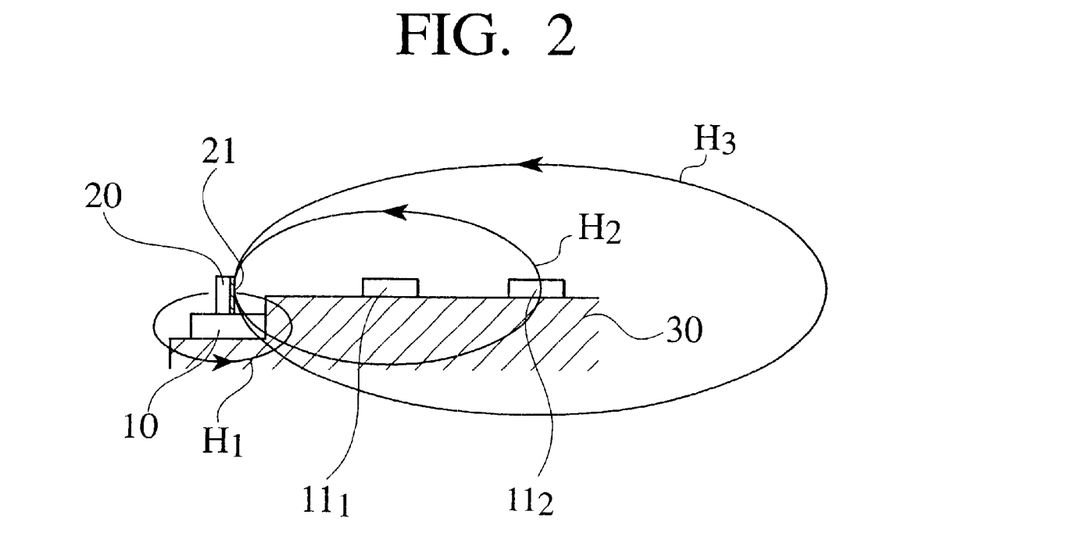
FIG. 2 is a view for explaining an operation of the current detector of the first embodiment of the invention.

If a to-be measured current flows through the to-be measured conductor 10, a magnetic flux $H_1$ is generated by a magnetic field of a magnitude corresponding to that of the to-be measured current in accordance with corkscrew rule of ampere as shown in FIG. 2. Since this magnetic flux $H_1$ enters into the magnetic-force sensing face 21 of the Hall element 20 perpendicularly, the Hall element 20 generates a voltage signal corresponding to a density of the magnetic flux $H_1$.

When a current flows through the first conductor $11_1$, a magnetic flux $H_2$ is generated by a magnetic field of a magnitude corresponding to that of the current as shown in FIG. 2. However, since the positional relation between the to-be measured conductor 10 and the first conductor $11_1$ is set such that the plane including the longitudinal center line of the first conductor $11_1$ passes through the center of the magnetic-force sensing face 21 of the Hall element 20 and the plane is perpendicular to the magnetic-force sensing face 21, on the magnetic-force sensing face 21, the magnetic flux $H_2$ generated by the current flowing through the first conductor $11_1$ is in parallel to the magnetic-force sensing face 21.

The Hall element 20 only senses a perpendicular magnetic flux component passing through the magnetic-force sensing face 21. Therefore, the magnetic flux $H_2$ from the first conductor $11_1$ other than the to-be measured conductor 10 is sensed as a sufficiently small value as compared with the magnetic flux $H_1$ from the to-be measured conductor 10. Thus, the magnetic flux $H_2$ generated by the current flowing through the first conductor $11_1$ is small and negligible, and the voltage signal generated by the Hall element 20 is not affected by this.

The second conductor $11_2$ is similar to the first conductor $11_1$. That is, when a current flows through the second conductor $11_2$, a magnetic flux $H_3$ is generated by a magnetic field of a magnitude corresponding to that of the current. However, since the positional relation between the to-be measured conductor 10 and the second conductor $11_2$ is set such that the plane including the longitudinal center line of the second conductor $11_2$ passes through the center of the magnetic-force sensing face 21 of the Hall element 20 and the plane is perpendicular to the magnetic-force sensing face 21, on the magnetic-force sensing face 21, the magnetic flux $H_3$ generated by the current flowing through the second conductor $11_2$ is in parallel to the magnetic-force sensing face 21.

As described above, the Hall element 20 only senses a perpendicular magnetic flux component passing through the magnetic-force sensing face 21. Therefore, the magnetic flux $H_3$ from the second conductor $11_2$ other than the to-be measured conductor 10 is sensed as a sufficiently small value as compared with the magnetic flux $H_1$ from the to-be measured conductor 10. Thus, the magnetic flux $H_3$ generated by the current flowing through the second conductor $11_2$ is small and negligible, and the voltage signal generated by the Hall element 20 is not affected by this.

According to the current detector of the first embodiment, the to-be measured conductor 10 is disposed on the substrate 30 such that the magnetic flux $H_1$ generated by the to-be measured current enters into the magnetic-force sensing face 21 of the Hall element 20. The first conductor $11_1$ and the second conductor $11_2$ except the to-be measured conductor 10 are disposed on the substrate 30 such that the magnetic flux $H_2$ and the magnetic flux $H_3$ generated by currents flowing through the first and second conductors $11_1$ and $11_2$ are substantially parallel to the magnetic-force sensing face 21. Therefore, the Hall element 20 only senses the magnetic flux $H_1$ generated by the to-be measured current flowing through the to-be measured conductor 10, and the magnetic flux $H_2$ and the magnetic flux $H_3$ generated by the first conductor $11_1$ and the second conductor $11_2$ other than the to-be measured conductor 10 are not sensed. Therefore, it is possible to precisely detect the to-be measured current flowing through the to-be measured conductor 10. Further, since the current detector has one Hall element 20, it is possible to provide an inexpensive current detector.

Although the Hall element 20 is secured onto the to-be measured conductor 10 in the first embodiment, it is not always necessary to secure the Hall element 20 onto the to-be measured conductor 10. The Hall element 20 may be disposed any way only if the above-described positional relation between the first conductor $11_1$, the second conductor $11_2$ and the Hall element 20 can be maintained. For example, the Hall element 20 may be secured directly to the substrate 30, or may be secured to the electric connection box (not shown).

(Second Embodiment)

Figure 3:
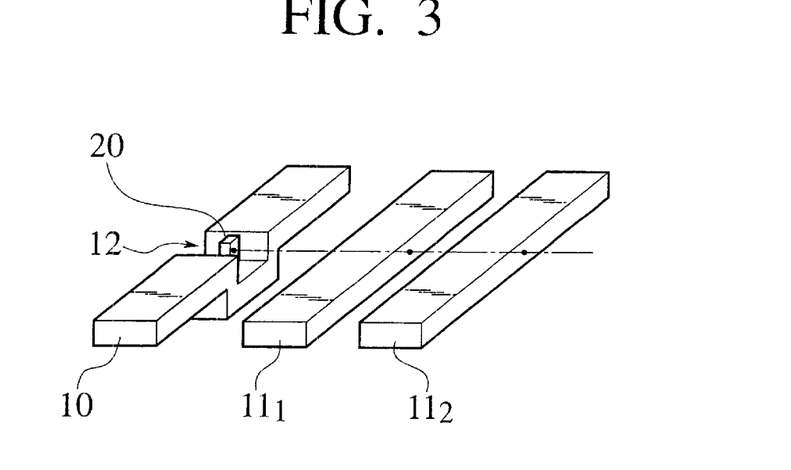
FIG. 3 is a perspective view showing a structure of a current detector according to a second embodiment of the invention.

FIG. 3 is a perspective view showing a structure of a current detector according to a second embodiment of the invention. This current detector comprises a conductor to be measured 10, a first conductor $11_1$, a second conductor $11_2$, a Hall element 20 and a substrate 30. These elements are usually accommodated in an electric connection box (not shown). In the second embodiment, a magnetic-force collecting core is not used.

The to-be measured conductor 10 is a conductor through which a to-be measured current flows. The to-be measured conductor 10 is formed with a bent portion 12 formed by bending a portion of the to-be measured conductor 10 into a U-shape. The Hall element 20 is secured to the bent portion 12. The Hall element 20 corresponds to a magnetic-electric power converting element of the present invention, and is the same as that used in the first embodiment.

The first conductor $11_1$ and the second conductor $11_2$ are linear conductors through which current other than the to-be measured current flows. The first and second conductors $11_1$ and $11_2$ are substantially parallel to the to-be measured conductor 10, and are disposed such that the to-be measured conductor 10 except the bent portion 12, and the first and second conductors $11_1$ and $11_2$ are flush with each other on the same plane. The to-be measured conductor 10 and the first and second conductors $11_1$ and $11_2$ may be secured to the electric connection box (not shown) for example, or may be secured to the substrate (not shown) as in the first embodiment.

Figure 4:
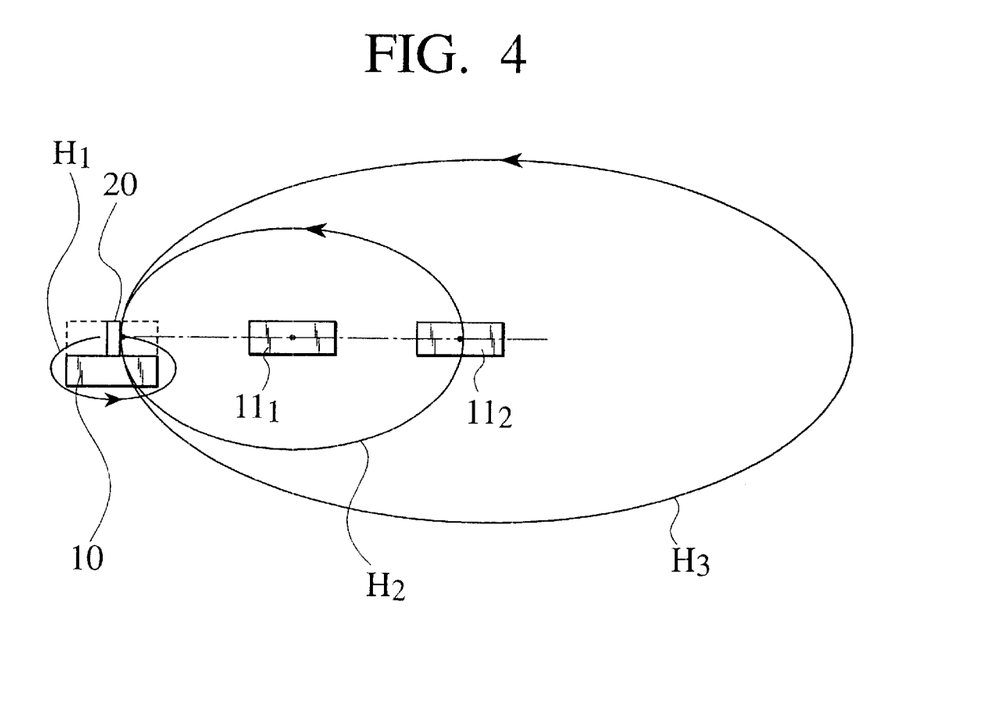
FIG. 4 is a view for explaining an operation of the current detector of the second embodiment of the invention.

As shown in FIGS. 3 and 4, a depth of the bent portion 12 formed in the to-be measured conductor 10 is set such that a plane formed by a longitudinally center line of the first conductor $11_1$ and a longitudinally center line of the second conductor $11_2$ passes through a center of a magnetic-force sensing face 21 of the Hall element 20 secured to the to-be measured conductor 10, and the plane is perpendicular to the magnetic-force sensing face 21.

Although the two conductors $11_1$ and $11_2$ are provided in addition to the to-be measured conductor 10 in the second embodiment, the number of the conductors may be one, or three or more.

Next, the operation of the current detector having the above structure according to the second embodiment of the present invention will be explained.

If a to-be measured current flows through the to-be measured conductor 10, a magnetic flux $H_1$ is generated by a magnetic field of a magnitude corresponding to that of the to-be measured current in accordance with corkscrew rule of ampere as shown in FIG. 4. Since this magnetic flux $H_1$ enters into the magnetic-force sensing face 21 of the Hall element 20 perpendicularly, the Hall element 20 generates a voltage signal corresponding to a density of the magnetic flux $H_1$.

When a current flows through the first conductor $11_1$, a magnetic flux $H_2$ is generated by a magnetic field of a magnitude corresponding to that of the current as shown in FIG. 4. However, since the positional relation between the to-be measured conductor 10 and the first conductor $11_1$ is set such that the plane including the longitudinal center line of the first conductor $11_1$ passes through the center of the magnetic-force sensing face 21 of the Hall element 20 and the plane is perpendicular to the magnetic-force sensing face 21, on the magnetic-force sensing face 21, the magnetic flux $H_2$ generated by the current flowing through the first conductor $11_1$ is in parallel to the magnetic-force sensing face 21. Therefore, the Hall element 20 only senses a perpendicular magnetic flux component passing through the magnetic-force sensing face 21 as described above. For this reason, the magnetic fluxes $H_2$ and $H_3$ from the first conductor $11_1$ other than the to-be measured conductor 10 are sensed as a sufficiently small value as compared with the magnetic flux $H_1$ from the to-be measured conductor 10. Thus, the magnetic fluxes $H_2$ and $H_3$ are small and negligible, and the voltage signal generated by the Hall element 20 is not affected by them.

As described above, according to the current detector of the second embodiment, the Hall element 20 is disposed in the bent portion 12 formed in the to-be measured conductor 10 such that the magnetic flux $H_1$ generated by the to-be measured current flowing through the to-be measured conductor 10 enters into the magnetic-force sensing face 21 of the Hall element 20 perpendicularly.

The first and second conductors $11_1$ and $11_2$ except the to-be measured conductor 10 are disposed such that the magnetic fluxes $H_2$ and $H_3$ generated by currents flowing through therethrough are substantially parallel to the magnetic-force sensing face 21 on the magnetic-force sensing face 21. Therefore, as in the current detector of the first embodiment, the Hall element 20 only senses the magnetic flux $H_1$ generated by the current flowing through the to-be measured conductor 10, and the magnetic flux $H_2$ and the magnetic flux $H_3$ generated by the first conductor $11_1$ and the second conductor $11_2$ other than the to-be measured conductor 10 are not sensed. Therefore, it is possible to precisely detect the to-be measured current flowing through the to-be measured conductor 10. Further, since the current detector has one Hall element 20, it is possible to provide an inexpensive current detector.

Although the Hall element 20 is secured onto the to-be measured conductor 10 in the second embodiment, it is not always necessary to secure the Hall element 20 onto the to-be measured conductor 10. The Hall element 20 may be disposed any way only if the above-described positional relation between the first conductor $11_1$, the second conductor $11_2$ and the Hall element 20 can be maintained. For example, the Hall element 20 may be secured directly to the substrate 30, or may be secured to the electric connection box (not shown).

Figure 5:
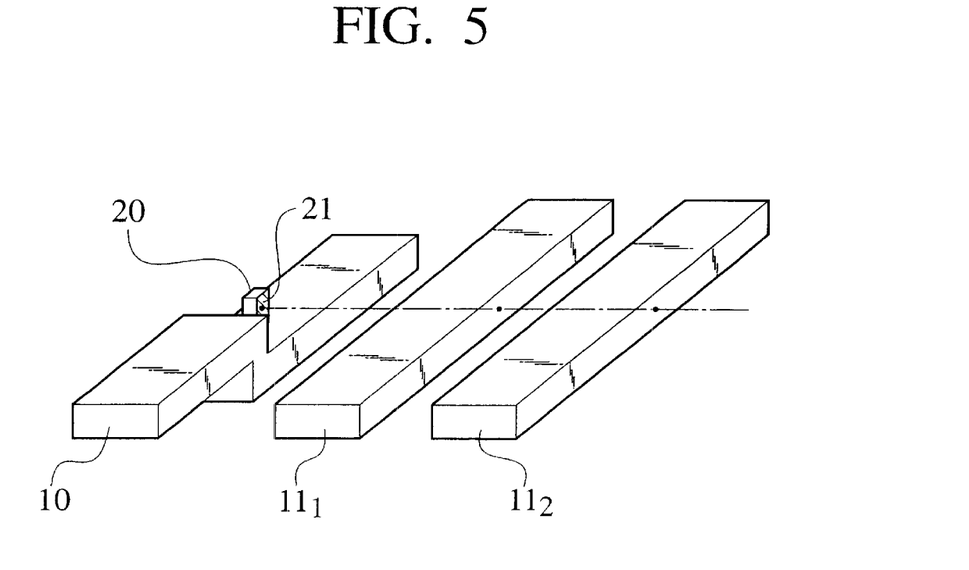
FIG. 5 is a perspective view showing a modification of the current detector according to the second embodiment of the invention.

In the current detector of the second embodiment, the to-be measured conductor 10 may be bent into a crank-shape as shown in FIG. 5. In this case also, a depth of the bent portion formed in the to-be measured conductor 10 is set such that a plane formed by a longitudinally center line of the first conductor $11_1$ and a longitudinally center line of the second conductor $11_2$ passes through a center of a magnetic-force sensing face 21 of the Hall element 20 secured to the to-be measured conductor 10, and the plane is perpendicular to the magnetic-force sensing face 21.

According to the structure having the to-be measured conductor formed with the crank-shaped bent portion, the number of bent portions of the to-be measured conductor 10 is reduced, there is an effect, in addition to the above effect, that the to-be measured conductor 10 can be produced easier as compared with the to-be measured conductor having the U-shaped bent portion 12.

Each the current detectors of the first and second embodiments has sufficient detecting sensibility for judging a current without using a core when the to-be measured current is large and magnetic flux generated from another conductor is also large. Therefore, the current detectors can effectively be applied to an F/L box and the like.

(Third Embodiment)

A current detector of the third embodiment is different from those of the first and second embodiments in that a plurality of to-be conductors are provided.

Figure 6:
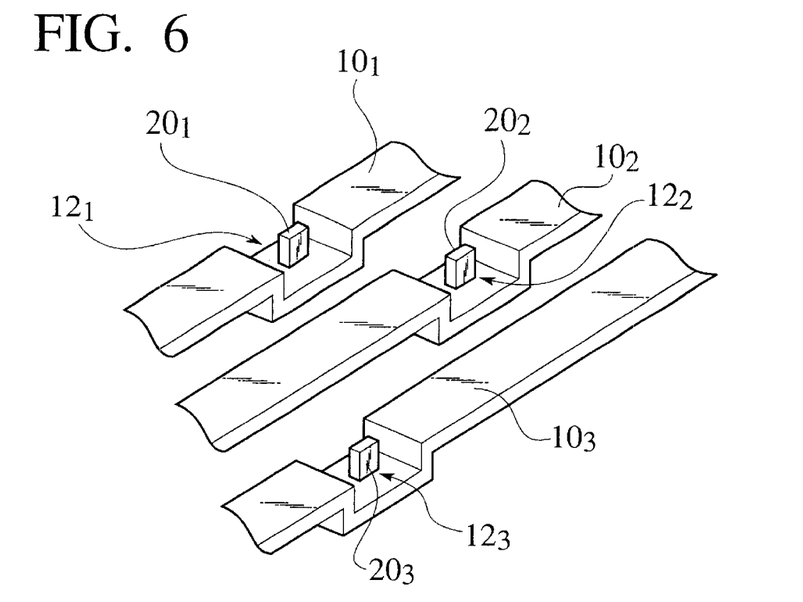
FIG. 6 is a perspective view showing a structure of current detectors according to a third embodiment of the invention.
Figure 7:
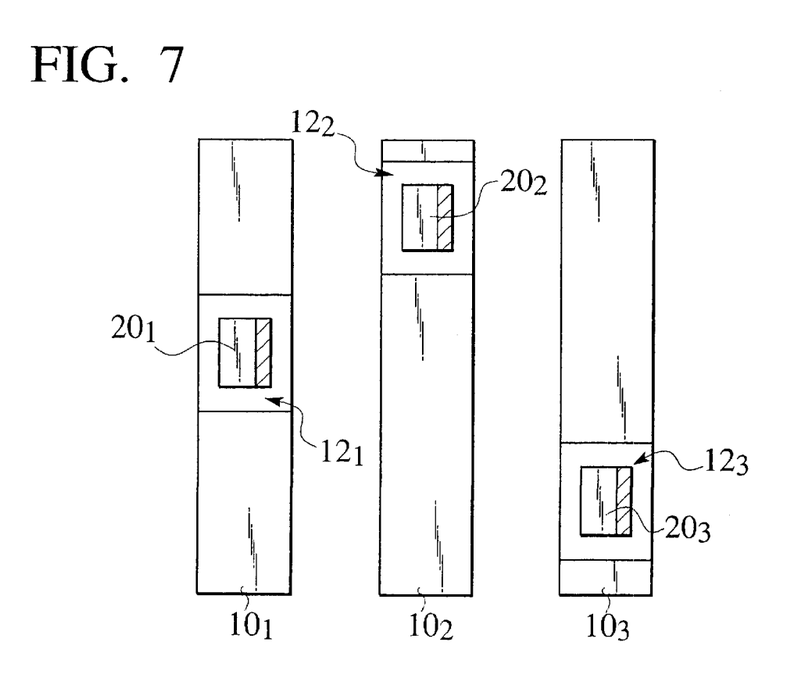
FIG. 7 is a plan view showing the structure of the current detectors according to the third embodiment of the invention.
Figure 8:
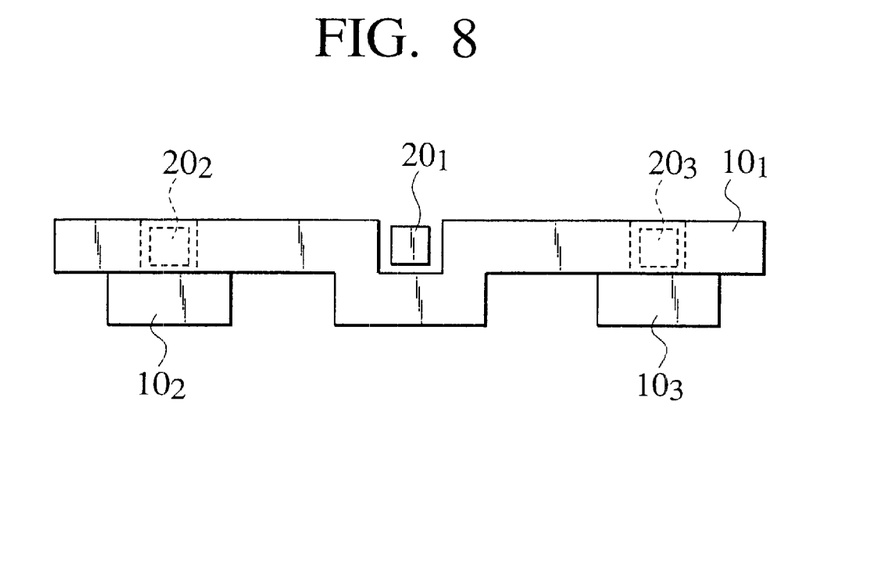
FIG. 8 is a side view showing the structure of the current detectors according to the third embodiment of the invention.

FIG. 6 is a perspective view showing a structure of the current detectors according to a third embodiment of the invention, FIG. 7 is a plan view of the conductors, and FIG. 8 is a side view of the conductors. This current detector comprises a first to-be measured conductor $10_1$, a second to-be measured conductor $10_2$, a third to-be measured conductor $10_3$, a first Hall element $20_1$, a second Hall element $20_2$ and a third Hall element $20_3$. These elements are usually accommodated in an electric connection box (not shown). In the third embodiment, a magnetic-force collecting core is not used.

The first to third to-be measured conductors $10_1$ to $10_3$ are conductors through which to-be measured currents flow, and have the same structures as that of the to-be measured conductor 10 of the second embodiment. Portions of the first to third to-be measured conductors $10_1$ to $10_3$ are bent into U-shapes, thereby forming first to third bent portions $12_1$ to $12_3$, respectively. The first to third Hall elements $20_1$ to $20_3$ are secured to the first to third bent portions $12_1$ to $12_3$, respectively. The Hall elements $20_1$ to $20_3$ correspond to the magnetic-electric power converting element of the present invention, and are the same as that used in the first embodiment.

The first to third to-be measured conductors $10_1$ to $10_3$ except the first to third bent portions $12_1$ to $12_3$ are substantially parallel to one another and flush with the same plane. Further, the first to third bent portions $12_1$ to $12_3$ formed in the first to third to-be measured conductors $10_1$ to $10_3$ are located such that they are not aligned to one another in the longitudinal direction of the to-be measured conductors as shown in FIGS. 6 to 8. The first to third to-be measured conductors $10_1$ to $10_3$ may be secured to the electric connection box (not shown) for example, or may be secured to the substrate (not shown) as in the first embodiment.

Like the to-be measured conductor 10 of the first embodiment, a depth of each of the first to third bent portions $12_1$ to $12_3$ formed in the first to third to-be measured conductors $10_1$ to $10_3$ is set such that a plane formed by longitudinally center lines of the other two to-be measured conductors passes through a center of a magnetic-force sensing face of the Hall element secured to the to-be measured conductor, and the plane is perpendicular to the magnetic-force sensing face.

Although the three conductors $10_1$ to $10_3$ are provided in this third embodiment, the number of the conductors may be two, or four or more. Further, a to-be measured conductor and a conductor other than the to-be measured conductor may exist.

Next, the operation of the current detector having the above structure according to the third embodiment of the present invention will be explained.

If a to-be measured current flows through the first to-be measured conductor $10_1$, a magnetic flux $H_1$ is generated by a magnetic field of a magnitude corresponding to that of the to-be measured current in accordance with corkscrew rule of ampere. Since this magnetic flux $H_1$ enters into the magnetic-force sensing face of the Hall element $20_1$ perpendicularly, the Hall element $20_1$ generates a voltage signal corresponding to a density of the magnetic flux $H_1$.

When a current flows through the second to-be measured conductor $10_2$, the magnetic flux $H_2$ is generated by a magnetic field of a magnitude corresponding to that of this current. However, the position of the bent portion $12_1$ formed in the first to-be measured conductor $10_1$ is not aligned with other bent portions in the longitudinal direction of the second to-be measured conductor $10_2$, and the positional relation of the first and second to-be measured conductors $10_1$ and $10_2$ is set such that the plane including the longitudinally center lines excluding the bent portion $12_2$ of the second to-be measured conductor $10_2$ passes through the center of the magnetic-force sensing face of the Hall element $20_1$, and the plane is perpendicular to this magnetic-force sensing face. Therefore, the magnetic flux $H_2$ generated by the current flowing through the second to-be measured conductor $10_2$ is in parallel to the magnetic-force sensing face of the first Hall element $20_1$ on the magnetic-force sensing face.

Therefore, as described above, the first Hall element $20_1$ only senses a perpendicular magnetic flux component passing through the magnetic-force sensing face. For this reason, the magnetic fluxes $H_2$ from the second to-be measured conductor $10_2$ is sensed as a sufficiently small value as compared with the magnetic flux $H_1$ from the first to-be measured conductor $10_1$. The same can be said for the magnetic flux $H_3$ of the third to-be measured conductor $10_3$. Thus, the magnetic fluxes $H_2$ and $H_3$ are small and negligible, and the voltage signal generated by the first Hall element $20_1$ is not affected by them.

The operation in which the to-be measured current flows through the first to-be measured conductor $10_1$ was explained above, but an operation in which the to-be measured current flows through the second to-be measured conductor $10_2$ or third to-be measured conductor $10_3$ is the same.

According to the current detector of the third embodiment, the first to third Hall elements $20_1$ to $20_3$ are disposed on the first to third bent portions $12_1$ to $12_3$ of the first to third to-be measured conductors $10_1$ to $10_3$, and the first to third bent portions $12_1$ to $12_3$ are not aligned with one another in the longitudinal direction of the to-be measured conductors. Therefore, the to-be measured conductor does not affect a Hall element disposed on the other to-be measured conductors. Thus, it is possible to precisely detect currents flowing through the first to third to-be measured conductors $10_1$ to $10_3$ arranged side-by-side without being affected by other to-be measured conductors.

Although the first to third Hall elements $20_1$ to $20_3$ are secured onto the first to third to-be measured conductors $10_1$ to $10_3$ in the third embodiment, it is not always necessary to secured the first to third Hall elements $20_1$ to $20_3$ onto the first to third to-be measured conductors $10_1$ to $10_3$. The first to third Hall elements $20_1$ to $20_3$ may be disposed any way only if the above-described positional relation can be maintained. For example, the first to third Hall elements $20_1$ to $20_3$ may be secured directly to the substrate (not shown), or may be secured to the electric connection box (not shown).

In the current detector of the third embodiment, each of the first to third to-be measured conductors $10_1$ to $10_3$ may be bent into a crank-shape. In this case also, a depth of each of the bent portions $12_1$ to $12_3$ formed in the first to third to-be measured conductors $10_1$ to $10_3$ is set such that a plane formed by the longitudinally center lines of the other two to-be measured conductors passes through the center of the magnetic-force sensing face of the Hall element secured to the to-be measured conductor, and the plane is perpendicular to the magnetic-force sensing face as in the current detector 10 of the first embodiment.

According to the structure having the to-be measured conductor formed with the crank-shaped bent portion, the number of bent portions of each of the first to third to-be measured conductors $10_1$ to $10_3$ is reduced, there is an effect, in addition to the above effect, that the to-be measured conductor can be produced easier as compared with the to-be measured conductor having the U-shaped bent portion.

(Fourth Embodiment)

Figure 9:
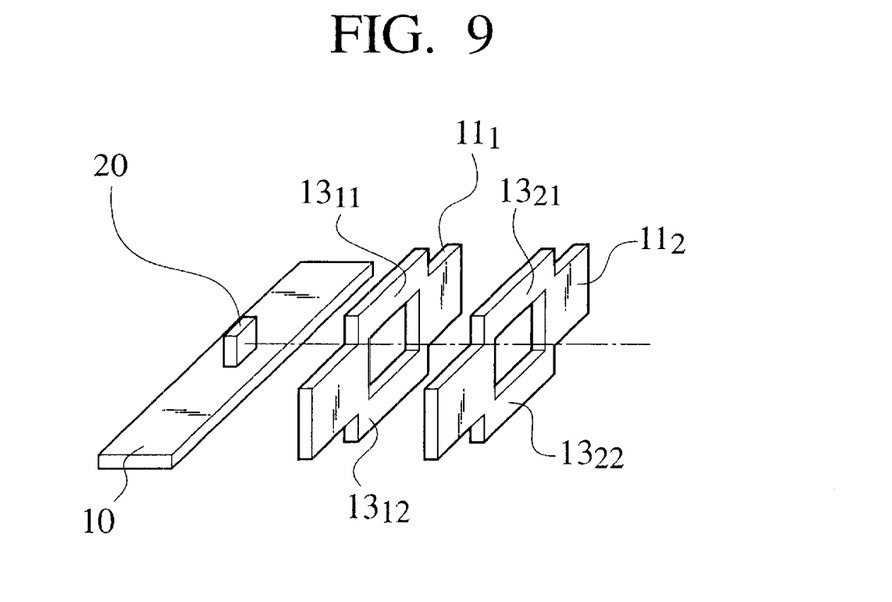
FIG. 9 is a perspective view showing a structure of a current detector according to a fourth embodiment of the invention.

FIG. 9 is a perspective view showing a structure of a current detector according to a fourth embodiment of the invention. This current detector comprises the to-be measured conductor 10, the first conductor $11_1$, the second conductor $11_2$ and the Hall element 20. These elements are usually accommodated in an electric connection box (not shown). In the fourth embodiment, a magnetic-force collecting core is not used.

The to-be measured conductor 10 is a linear conductor through which a to-be measured current flows, and the Hall element 20 is secured on the to-be measured conductor 10. The Hall element 20 corresponds to a magnetic-electric power converting element of the present invention, and is the same as that used in the first embodiment.

The first conductor $11_1$ is a conductor through which a current other than the to-be measured current flows. The first conductor $11_1$ is formed with a through hole. This through hole forms linear first and second branch paths which bisect a current flowing through the conductor. The second conductor $11_2$ also has the same structure to the first conductor $11_1$.

The first and second conductors $11_1$ and $11_2$ are disposed substantially parallel to the to-be measured conductor 10. The to-be measured conductor 10, and first and second conductors $11_1$ and $11_2$ may be secured to the electric connection box (not shown) for example, or may be secured to the substrate (not shown) as in the first embodiment.

The Hall element 20 is secured to the to-be measured conductor 10 such that a plane separated away from a first branch path $13_{11}$ and a second branch path $13_{12}$ of the first conductor $11_1$ through equal distances, and separated away from a first branch path $13_{21}$ and a second branch path $13_{22}$ of the second conductor $11_2$ through equal distances passes through a center of the magnetic-force sensing face 21 of the Hall element 20, and the plane is perpendicular to the magnetic-force sensing face 21.

Although the two conductors $11_1$ and $11_2$ are provided in addition to the to-be measured conductor 10 in the fourth embodiment, the number of the conductors may be one, or three or more.

Next, the operation of the current detector having the above structure according to the fourth embodiment of the present invention will be explained.

Figure 11:
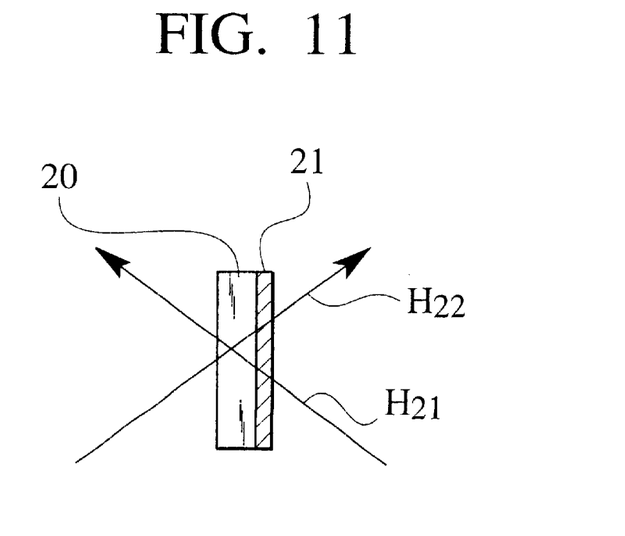
FIG. 11 is a view for explaining the operation of the current detector of the fourth embodiment of the invention.

If a to-be measured current flows through the first to-be measured conductor 10, a magnetic flux $H_1$ is generated by a magnetic field of a magnitude corresponding to that of the to-be measured current in accordance with corkscrew rule of ampere as shown in FIG. 11. Since this magnetic flux $H_1$ enters into the magnetic-force sensing face 21 of the Hall element 20 perpendicularly, the Hall element 20 generates a voltage signal corresponding to a density of the magnetic flux $H_1$.

If the current flows through the first conductor $11_1$, the current is divided into two halves, and the divided currents flow through the first branch path $13_{11}$ and the second branch path $13_{12}$, respectively. As shown in FIG. 11, a magnetic flux $H_{21}$ is generated by a magnetic field of a magnitude corresponding to that of the current flowing through the first branch path $13_{11}$, and a magnetic flux $H_{22}$ is generated by a magnetic field of a magnitude corresponding to that of the current flowing through the second branch path $13_{12}$.

The positional relation between the to-be measured conductor 10 and the first conductor $11_1$ is set such that the plane separated away from the first branch path $13_{11}$ and the second branch path $13_{12}$ of the first conductor $11_1$ through equal distances, and separated away from the first branch path $13_{21}$ and the second branch path $13_{22}$ of the second conductor $11_2$ through equal distances passes through the center of the magnetic-force sensing face 21 of the Hall element 20, and the plane is perpendicular to the magnetic-force sensing face 21. Therefore, the magnetic fluxes $H_{21}$ and $H_{22}$ are generated such that they cross each other on the magnetic-force sensing face 21 of the Hall element 20.

Here, since the current flowing through the first branch path $13_{11}$ of the first conductor $11_1$ is equal to the current flowing through the second branch path $13_{12}$, as shown in FIG. 11, the magnetic fluxes $H_{21}$ and $H_{22}$ have equal magnitude and cross each other at equal angles with respect to the magnetic-force sensing face 21 on the magnetic-force sensing face 21. Therefore, a horizontal component of the magnetic flux $H_{21}$ (component which is vertical to the magnetic-force sensing face) and a horizontal component of the magnetic flux $H_{22}$ (component which is vertical to the magnetic-force sensing face) are canceled by each other and the vertical component (component parallel to the magnetic-force sensing face) double and remain.

As described above, the Hall element 20 only senses a perpendicular magnetic flux component passing through the magnetic-force sensing face 21. Therefore, the magnetic flux $H_2$ from the first conductor $11_1$ other than the to-be measured conductor 10 is sensed as a sufficiently small value as compared with the magnetic flux $H_1$ from the to-be measured conductor 10. Thus, the magnetic fluxes $H_{21}$ and $H_{22}$ are small and negligible, and the voltage signal generated by the Hall element 20 is not affected by this. The second conductor $11_2$ is also operated in the same manner when a current flows therethrough and thus, and the voltage signal generated by the Hall element 20 is not affected by this.

Figure 10:
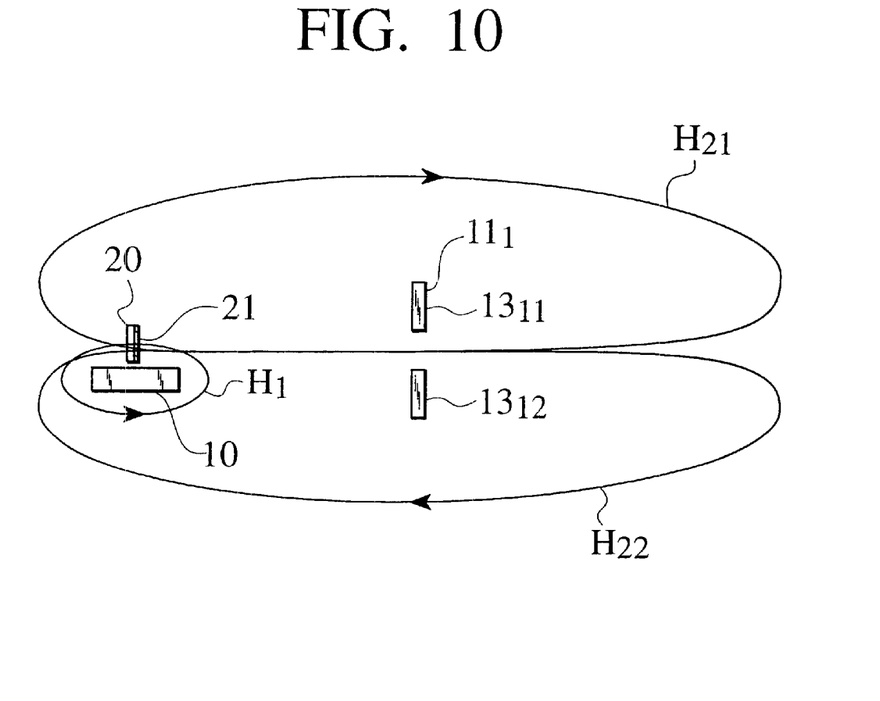
FIG. 10 is a view for explaining an operation of the current detector of the fourth embodiment of the invention.

According to the current detector of the fourth embodiment, the magnetic fluxes generated when currents flow through the first branch path $13_{11}$ and the second branch path $13_{12}$ of the first conductor $11_1$, and through the first branch path $13_{21}$ and the second branch path $13_{22}$ of the second conductor $11_2$ cross each other at equal angles with respect to the magnetic-force sensing face 21. Therefore, components which are vertical to the magnetic-force sensing face 21 are canceled by each other by each other.

When a current flowing through to-be measured conductor 10 is to be detected, it is possible to substantially completely eliminate an influence of the magnetic fluxes generated by the first conductor $11_1$ and the second conductor $11_2$ other than the to-be measured conductor 10. As a result, a current flowing through the to-be measured conductor 10 can be detected precisely. Further, since the current detector has one Hall element 20, it is possible to provide an inexpensive current detector.

Although the Hall element 20 is secured onto the to-be measured conductor 10 in the fourth embodiment, it is not always necessary to secure the Hall element 20 onto the to-be measured conductor 10. The Hall element 20 may be disposed any way only if the above-described positional relation between the first conductor $11_1$, the second conductor $11_2$ and the Hall element 20 can be maintained. For example, the Hall element 20 may be secured directly to the substrate 30, or may be secured to the electric connection box (not shown).

Figure 12:
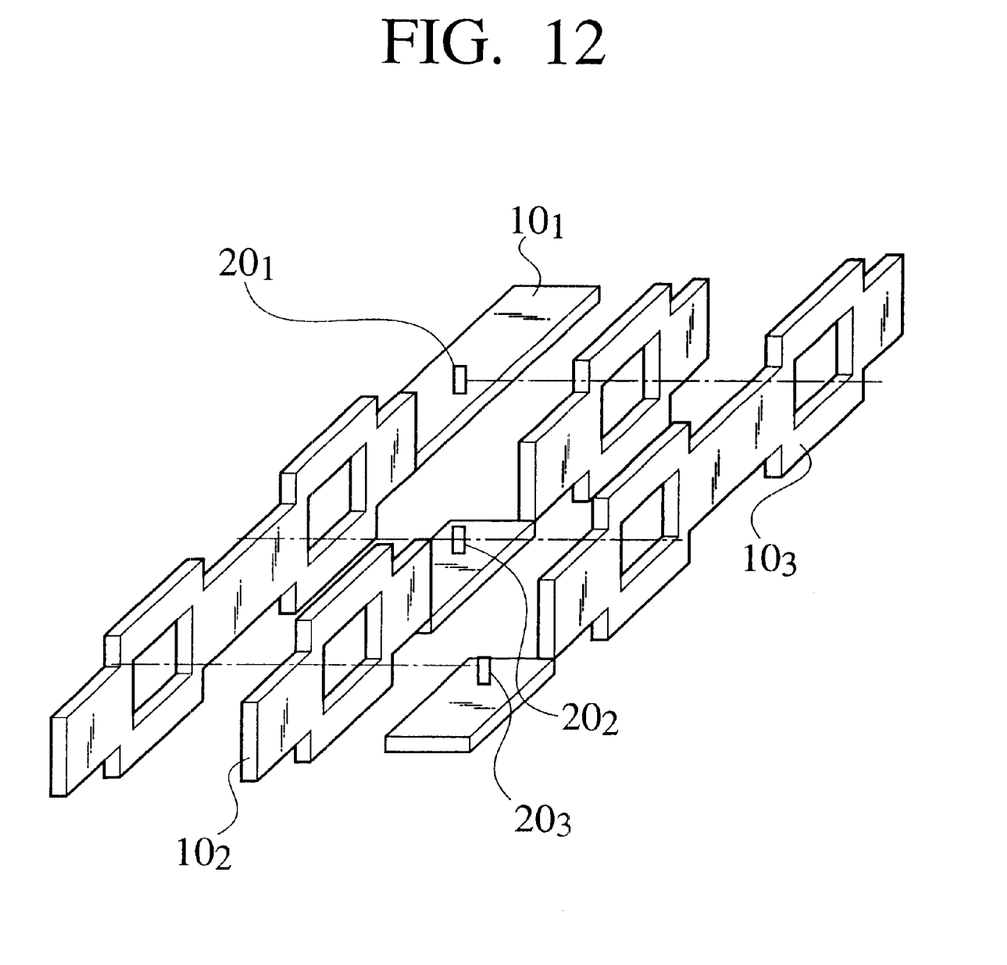
FIG. 12 is a perspective view showing a modification of the current detector according to the fourth embodiment of the invention.

The current detector of the fourth embodiment can be modified such that a plurality of to-be measured conductors are provided side-by-side as in the third embodiment. The modified current detector is shown in FIG. 12.

In this current detector, first to third Hall elements $20_1$ to $20_3$ secured to first to third to-be measured conductors $10_1$ to $10_3$ disposed substantially parallel to each other are disposed such that the first to third Hall elements $20_1$ to $20_3$ are not aligned with each other in the longitudinal direction of the to-be measured conductor, but each of the first to third Hall elements $20_1$ to $20_3$ is aligned to through holes of other two to-be measured conductors. The operation of this current detector is the same as that of the third embodiment except that magnetic fluxes generated from two of the three to-be measured conductors cross each other at equal angle with respect to the magnetic-force sensing face in the rest one magnetic-force sensing face of the Hall element disposed in the to-be measured conductor. Therefore, explanation of the operation is omitted.

According to this modified current detector, since each the to-be measured conductor does not influence a Hall element disposed in another to-be measured conductor. Therefore, it is possible to precisely detect a current flowing through each of the first to third to-be measured conductors $10_1$ to $10_3$ with out being affected by other to-be measured conductors.

What is claimed is:

1. A current detector system comprising:
   a to-be measured conductor disposed substantially in parallel with a neighboring conductor, a to-be measured current flowing through the to-be measured conductor and generating a first magnetic flux;
   a magnetic-electric power converting element having a magnetic-force sensing face and positioned in the vicinity of the to-be measured conductor such that the first magnetic flux enters the magnetic-force sensing face at substantially perpendicular angle;
   a substrate for supporting a to-be measured conductor and the neighboring conductor, the substrate being configured such that a second magnetic flux generated by a current flowing through the neighboring conductor aligns substantially parallel with respect to the magnetic-force sensing face at the magnetic-force sensing face,
   whereby the measurement of the first magnetic flux by the magnetic-force sensing face is substantially not affected by the second magnetic flux.

2. A current detector system according to claim 1, wherein the magnetic-force sensing face is disposed such that a plane including the neighboring passes substantially perpendicularly through a proximate center of the magnetic force sensing face.

3. A current detector system according to claim 1, wherein the magnetic-electric power converting element is secured on the to-be measured conductor.

4. A current detector system comprising:
   a to-be measured conductor having a U-shaped or crank-shaped bent portion, a to-be measured current flowing through the to-be measured conductor and generating a first magnetic field;
   a magnetic-electric power converting element having a magnetic-force sensing face and disposed in the vicinity of the bent portion such that the first magnetic flux enters the magnetic-force sensing face substantially perpendicularly; and
   a neighboring conductor being disposed such that a second magnetic flux generated by a current flowing through the neighboring conductor aligns substantially parallel with respect to the magnetic-force sensing face at the magnetic-force sensing face,
   whereby the second magnetic flux does not substantially affect the measurement of the first magnetic flux by the magnetic-force sensing face.

5. A current detector system according to claim 4, wherein the magnetic-force sensing face is disposed such that a plane including the neighboring conductor passes substantially perpendicularly through a proximate center of the magnetic force sensing face.

6. A current detector system for measuring a plurality of to-be measured currents flowing through a plurality of to-be measured conductors, respectively, the system comprising:
   the plurality of to-be measured conductors disposed in substantially parallel to one another, each of the to-be measured conductors comprising a U-shaped or a crank-shaped bent portion;
   the bent portions of the to-be measured conductors disposed such that the bent portions are not aligned with one another in a longitudinal direction;
   magnetic-electric power converting elements each having a magnetic-force sensing face and disposed in the vicinity of the bent portion of each of the to-be measured conductors such that a magnetic flux generated by the to-be measured current flowing through each of the to-be measured conductors enters into the corresponding magnetic-force sensing face substantially perpendicularly,
   whereby the measurement of the magnetic flux generated from one of the to-be measured conductor is substantially not affected by the other magnetic flux generated from the other to-be measured conductor.

7. A current detector according to claim 6, wherein magnetic-force sensing face of each of the magnetic-electric power converting elements is disposed such that a plane including the other to-be measured conductor excluding the bent portion passes substantially perpendicularly through a proximate center of the magnetic-force sensing face.

8. A current detector system comprising:
   a to-be measured conductor;
   a to-be measured current flowing through the to-be measured conductor and generating a first magnetic flux;
   a magnetic-electric power converting element having a magnetic-force sensing face and disposed in the vicinity of the to-be measured conductor such that the first magnetic flux enters the magnetic-force sensing face substantially perpendicularly; and
   a neighboring conductor having parallel branch paths for bisecting a current flowing through the neighboring conductor, the parallel branch paths disposed such that each of magnetic fluxes generated by the bisected currents in the branch paths crosses each other at equal angles at the magnetic-force sensing face,
   whereby a horizontal component of each of the magnetic fluxes cancels each other so that the measurement of the first magnetic flux is substantially not affected by the magnetic flux of the neighboring conductor.

9. A current detector according to claim 8, wherein the magnetic-force sensing face is disposed such that a horizontal plane including a midpoint between the branch paths passes substantially perpendicularly through a proximate center of said magnetic-force sensing face.

* * * * *